US005393572A

United States Patent [19]
Dearnaley

[11] Patent Number: 5,393,572
[45] Date of Patent: Feb. 28, 1995

[54] ION BEAM ASSISTED METHOD OF PRODUCING A DIAMOND LIKE CARBON COATING

[75] Inventor: Geoffrey Dearnaley, San Antonio, Tex.

[73] Assignee: Southwest Research Institute, San Antonio, Tex.

[21] Appl. No.: 273,492

[22] Filed: Jul. 11, 1994

[51] Int. Cl.⁶ .............................................. B05D 3/06
[52] U.S. Cl. .................................. 427/523; 427/577; 427/122; 427/249; 423/446
[58] Field of Search ............... 427/523, 577, 249, 122; 423/446; 156/DIG. 68

[56] References Cited

U.S. PATENT DOCUMENTS 4,961,958 10/1990 Desphandey et al. ............. 427/530
4,989,542 2/1991 Kamo .
5,055,318 10/1991 Deutchman et al. ................ 427/577
5,064,682 11/1991 Kiyama et al. ...................... 427/577
5,132,105 7/1992 Remo .
5,182,166 1/1993 Burton et al. .
5,209,916 5/1993 Gruen .
5,215,841 6/1993 Scharfe et al. .
5,227,038 7/1993 Smalley et al. .

Primary Examiner—Roy V. King
Attorney, Agent, or Firm—Rosenblatt & Associates

[57] ABSTRACT

The present invention relates to an ion beam assisted method of producing a diamond like carbon (DLC) coating on the surface of a material. More particular, the invention relates to an ion beam assisted method using a fullerene precursor to produce a DLC coating, wherein the chemical composition of the ion beam and precursor are selectively chosen to determine the physical properties of the DLC coating.

20 Claims, 4 Drawing Sheets

ION BEAM ASSISTED METHOD OF PRODUCING A DIAMOND LIKE CARBON COATING

BACKGROUND OF THE INVENTION

1. Field of the Invention

The present invention relates to an ion beam assisted method of producing a diamond like carbon (DLC) coating on the surface of a material. More particularly, the invention relates to an ion beam assisted method using a fullerene precursor to produce a DLC coating, wherein the chemical composition of the ion beam and precursor are selectively chosen to determine the physical properties of the DLC coating.

2. Description of the Prior Art

DLC coatings have been used in the prior art to provide a material with a hard outer coating. By minimizing the hydrogen content of a DLC coating, the hardness of the coating can be increased. The presence of hydrogen in a DLC coating can impair the infrared transmission capabilities of the DLC coating because of the absorption of energy in existing carbon-hydrogen (C-H) vibrations. Thus, it is desirable to minimize the content of hydrogen in a DLC coating.

Prior art methods for applying a DLC coating have employed vaporizable precursors such as low vapor pressure hydrocarbons, organo-metallic compounds, and siloxanes. In these prior art methods, energetic ions, typically with energies in the range of 5–100 KeV, are used to bombard a condensed film of the precursor in order to rupture C-H bonds, thereby releasing hydrogen from the precursor into the ambient environment. This ion bombardment results in a film consisting mainly of carbon with an atomic hydrogen content of approximately 10–15%. The precursor will also contain elements which were present before the ionic bombardment, as well as atomic species present in the ions used for bombardment.

It is desirable to use carbon in the form of graphite as a precursor in ion beam assisted methods to produce a DLC coating; however, the deposition of carbon by thermal evaporation requires a large dissipation of energy, either in a carbon arc or in the form of a powerful electron beam. Such sources of thermally evaporated carbon are likely to heat the material or workpiece to be coated, possibly altering or impairing its physical properties. Thus, prior art methods have not proven effective in allowing the use of carbon in the form of graphite for use in an ion beam assisted method of producing a DLC coating.

Prior art methods have used pulse laser deposition of carbon in order to deposit the carbon in a vacuum. This method is inefficient and costly. Its costs make it economically unattractive for large scale industrial application.

Another method of applying carbon is through dual ion beam sputtering. Because of carbon's low atomic number, dual ion beam sputtering is an inefficient method of depositing carbon. Prior art methods of depositing a DLC coating are expensive and inefficient.

SUMMARY OF THE INVENTION

The present invention provides an ion beam assisted method of producing a DLC coating on the surface of a material or workpiece. This method is both economical and energy efficient. The first step of the present invention is directing a vaporized stream of fullerene precursor toward a surface to be coated. The vaporized stream of fullerene precursor may be produced by thermal sublimation. As used herein, the term "fullerene" encompasses all molecular forms of carbon which close in upon themselves. Thus, the term "fullerene" includes $C_{48}$, $C_{60}$, $C_{70}$, $C_{72}$, $C_{94}$, and $C_{200}$. The fullerene precursor may comprise a noncarbonaceous side chain. In the present invention, the material composition of the side chains is selectively chosen in order to provide the DLC coating with desired physical characteristics.

The next step of the present invention is bombarding the surface to be coated and the fullerene precursor with an ion beam, having energies of at least 5 KeV, for a sufficient amount of time to rupture a sufficient number of carbon-to-carbon bonds in the precursor to produce an amorphous film comprising randomly disposed carbon atoms in a strongly bonded network. The species of the ion beam is selectively chosen in order to provide the DLC coating with desired physical characteristics.

In another embodiment of the present invention, third and fourth steps are added to the two steps described above in order to produce a multilayered DLC coating. In the third step, a vaporized stream of hydrocarbon precursor is directed toward the surface to be coated.

In the fourth step, the surface to be coated and the hydrocarbon precursor are bombarded with a second ion beam having energies of at least 5 KeV for a sufficient amount of time to rupture a sufficient number of carbon-to-hydrogen bonds in the precursor to produce a carbonaceous residue above the prior layer of amorphous film. These four steps can then be repeated as many times as is necessary to achieve a multilayered DLC coating with desired physical characteristics.

In this second embodiment of the invention, the ion beam used to bombard the fullerene precursor may be the same species as, or a different species from, the ion beam used to bombard the hydrocarbon precursor. Thus, the individual layers of the multilayered DLC coating can each have different physical properties, selectively chosen through selection of the ion beam species, as well as the precursor material.

DESCRIPTION OF THE PREFERRED EMBODIMENTS

Figure 1:
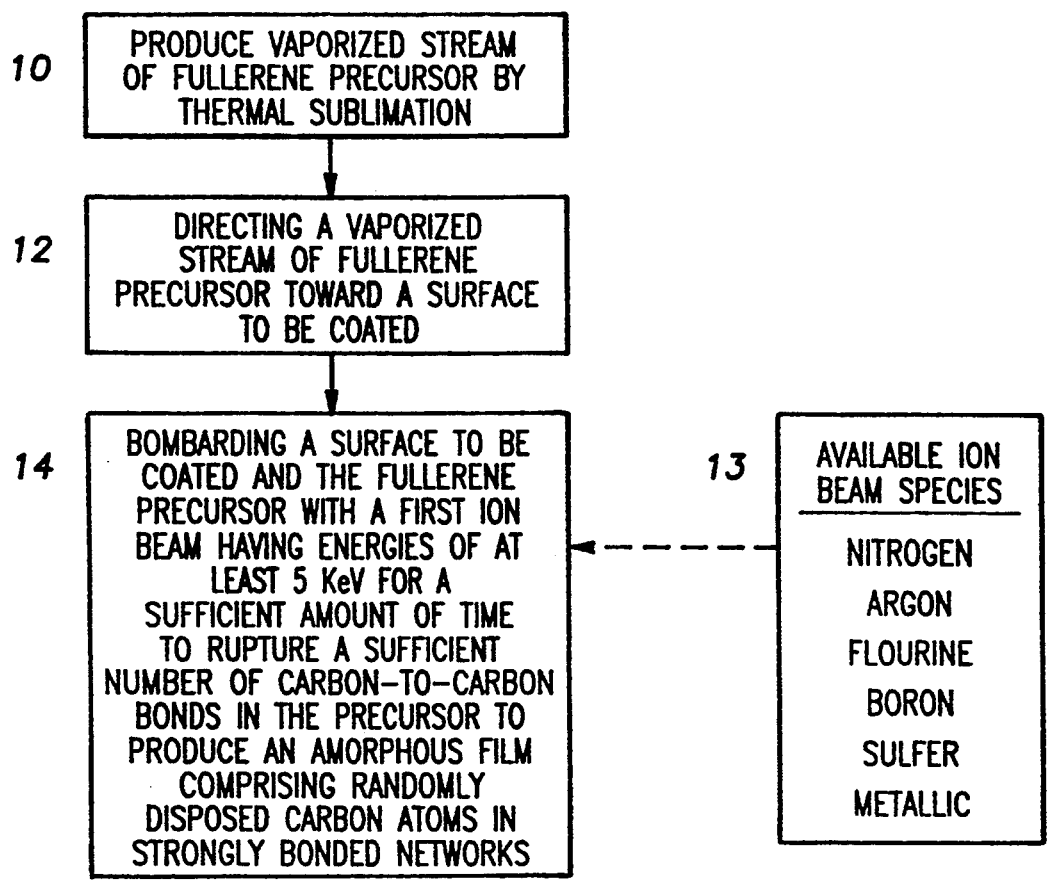
FIG. 1 is a block diagram of a first embodiment of the present invention.

A preferred embodiment of the present invention is depicted in FIG. 1. In such an embodiment, a vaporized stream of fullerene precursor is produced by thermal sublimation, as shown in block 10 of FIG. 1. The vaporized stream of fullerene precursor is then directed toward a surface to be coated, as shown in block 12 of FIG. 1.

The fullerene precursor is comprised of fullerene molecules. Those fullerene molecules may also comprise noncarbonaceous side chains, as shown in block 11 of FIG. 3. The noncarbonaceous side chains may comprise amino groups, silane, siloxane, or metal atoms, as shown in block 9 of FIG. 3. The physical properties to be incorporated in the DLC coating may be selectively chosen through the selection of noncarbonaceous species of the fullerene molecule side chains.

The careful selection of noncarbonaceous side chain species allows one practicing the present invention to selectively affect the physical properties of the DLC coating, depending upon the specific application of the DLC coating. For instance, the mechanical properties of the DLC coating may be enhanced by using an amino group as the noncarbonaceous side chain. Amino groups provide a means of incorporating nitrogen into the amorphous DLC coating. Silicon can be incorporated in the DLC coating by use of silane or siloxane as a noncarbonaceous side chain. The incorporation of silicon in the DLC coating can reduce the friction coefficient in the coatings. The use of a metallic side chain, such as platinum, can affect the catalytic activity of the DLC coating.

In the next step of the present invention, the surface to be coated and the fullerene precursor are bombarded with a first ion beam having energies of at least 5 KeV, for a sufficient amount of time to rupture a sufficient number of carbon-to-carbon bonds in the precursor to produce an amorphous film comprising randomly disposed carbon atoms in strongly bonded networks. In a preferred embodiment, the ion beams have energies in the range of 5–50 KeV, as shown in block 15 of FIG. 3.

Figure 3:
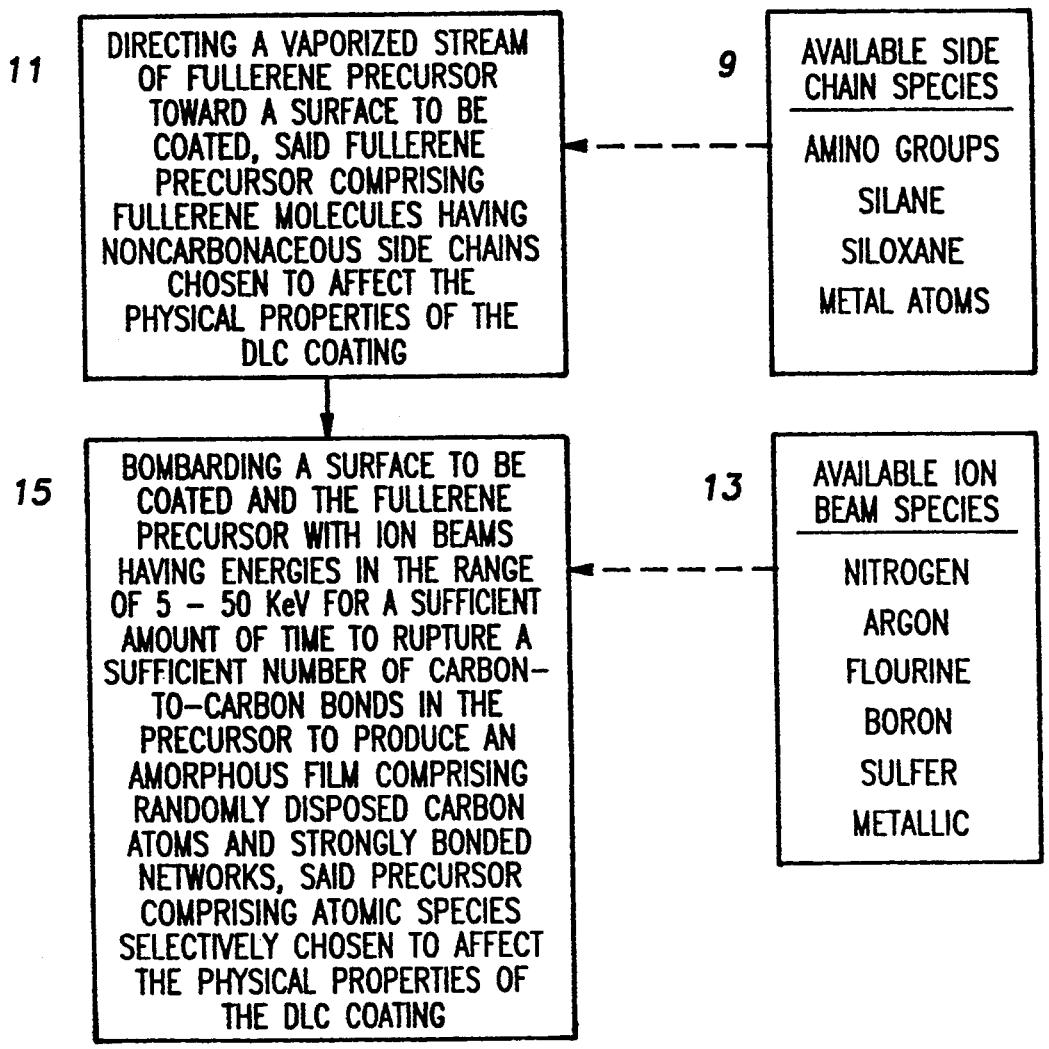
FIG. 3 is a block diagram of a third embodiment of the present invention.

The physical properties of the DLC coating can also be controlled by the selection of ion species used in this bombardment step, as shown in block 15 of FIG. 3. A group of suitable ion species is depicted in block 13 of FIGS. 1 and 3. These species include argon, boron, sulfur, and metallic species.

In one embodiment of the present invention, fluorine may be the selected ion species. Ion beams comprising $BF_2$ or $BF_3$ gas may be used to deposit fluorine in the DLC coating. Fluorine may be used to affect the coefficient of friction of the DLC coating.

Alternatively, the ion beam may incorporate nitrogen. It is believed that the use of a nitrogen species ion beam can affect the hardness of the DLC coating.

Figure 4:
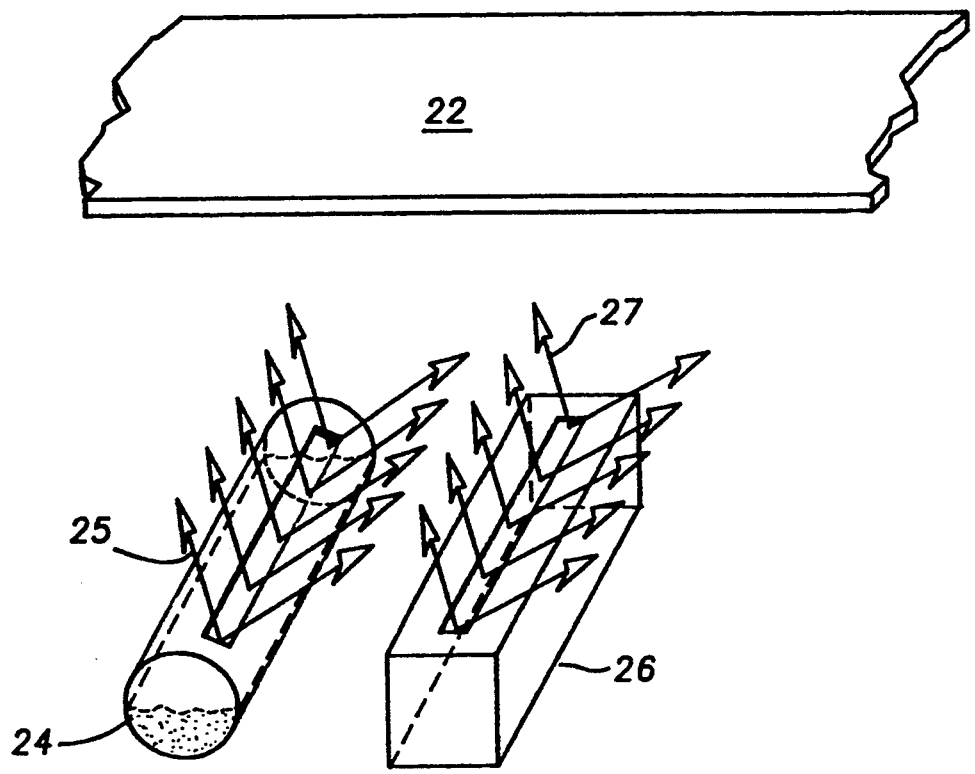
FIG. 4 is a diagram of an apparatus that can be used to practice the present invention.

An apparatus for practicing the present invention is depicted in FIG. 4. A source of vaporized precursor 24 is arranged to direct a vaporized steam of fullerene precursor 25 toward a workpiece 22 having a surface to be coated. An ion beam source 26 is used to bombard the surface to be coated and the fullerene precursor with ion beam 27, as shown in FIG. 4.

Another embodiment of the present invention provides for the capability of producing a multilayered DLC coating, each layer having unique physical properties. This is accomplished by varying the precursor material and/or ion species used in the deposition of each layer of DLC coating material.

Figure 2:
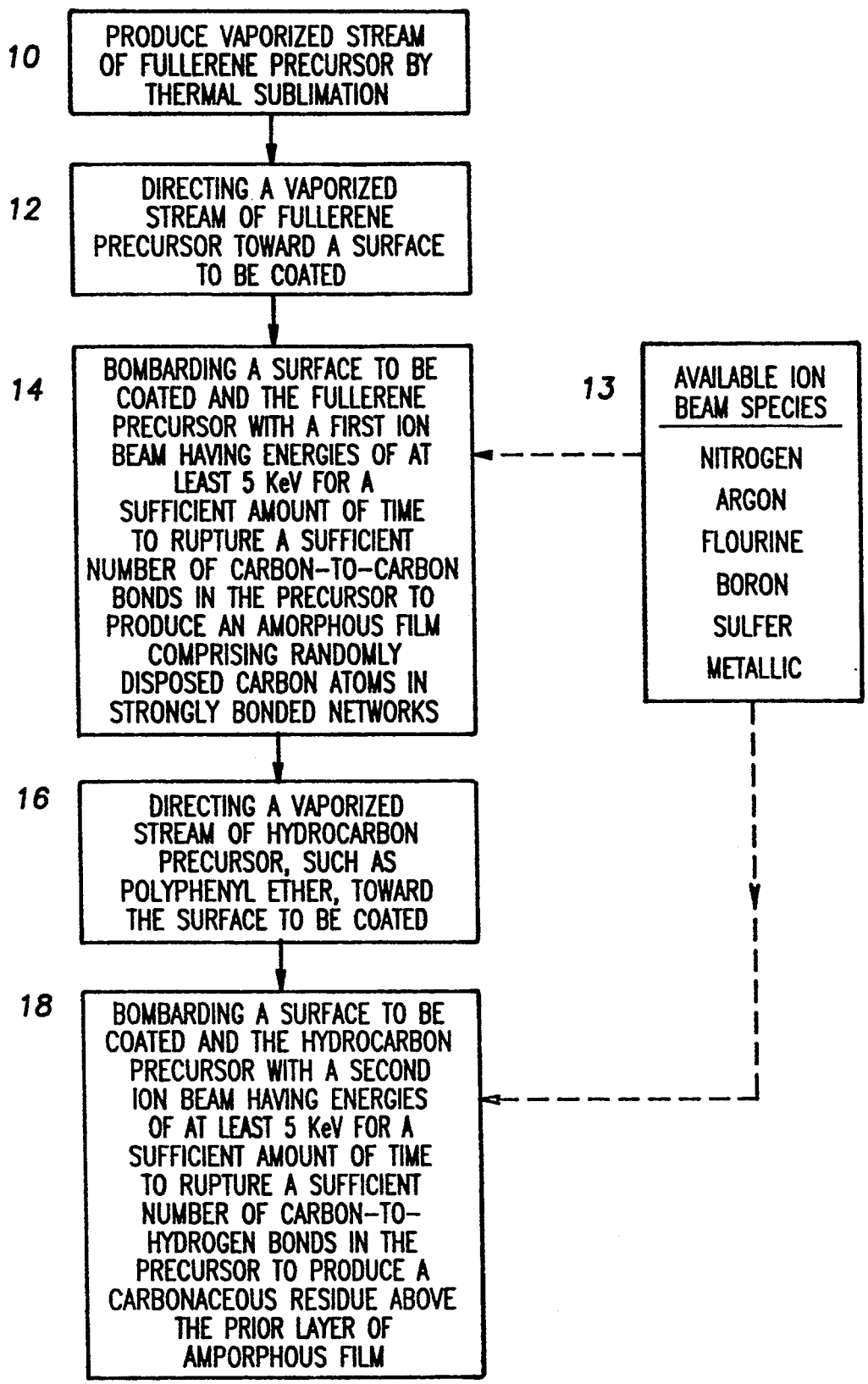
FIG. 2 is a block diagram of a second embodiment of the present invention.

The initial steps of this second embodiment of the present invention are identical to those depicted in blocks 10, 12, and 14 of FIG. 2. Additionally, a vaporized stream of hydrocarbon precursor is directed toward the surface to be coated, as shown in block 16 of FIG. 2. In a preferred embodiment, the hydrocarbon precursor is polyphenyl ether.

Next, the surface to be coated and the hydrocarbon precursor are bombarded with a second ion beam having energies of at least 5 KeV for a sufficient amount of time to rupture a sufficient number of carbon-to-hydrogen bonds in the precursor to produce a carbonaceous residue above the prior layer of amorphous film, that results from the steps depicted in blocks 10, 12, and 14 of FIG. 2. This ion bombardment step is depicted in block 18 of FIG. 2.

Many modifications and variations may be made in the embodiments described herein and depicted in the accompanying drawings without departing from the concept of the present invention. Accordingly, it is clearly understood that the embodiments described and illustrated herein are illustrative only and are not intended as a limitation upon the scope of the present invention.

What is claimed is:

1. An ion beam assisted method of producing a diamond-like carbon (DLC) coating comprising the steps of:
   (a) directing a vaporized stream of fullerene precursor toward a surface to be coated; and
   (b) bombarding the surface to be coated and the fullerene precursor with an ion beam having energies of at least 5 KeV for a sufficient amount of time to rupture a sufficient number of carbon-to-carbon bonds in the precursor to produce an amorphous film comprising randomly disposed carbon atoms in bonded networks.

2. The method of claim 1, wherein the vaporized stream of fullerene precursor is produced by thermal sublimation.

3. The method of claim 1, wherein the ion beam comprises nitrogen atoms.

4. The method of claim 1, wherein the ion beam comprises argon atoms.

5. The method of claim 1, wherein the ion beam comprises fluorine.

6. The method of claim 1, wherein said ion beam comprises boron atoms.

7. The method of claim 1, wherein said ion beam comprises sulfur atoms.

8. The method of claim 1, wherein said ion beam comprises atoms of a metallic species.

9. The method of claim 1, wherein said ion beams have energies in the range of 5–50 KeV.

10. The method of claim 1, wherein said fullerene precursor comprises fullerene molecules comprising noncarbonaceous side chains.

11. The method of claim 10, wherein said noncarbonaceous side chains comprise amino groups.

12. The method of claim 10, wherein said noncarbonaceous side chains comprise either silane or siloxane.

13. The method of claim 10, wherein said noncarbonaceous side chains comprise metal atoms.

14. An ion beam assisted method of producing a diamond-like carbon (DLC) coating comprising the steps of:
   (a) directing a vaporized stream of fullerene precursor toward a surface to be coated;
   (b) bombarding the surface to be coated and the fullerene precursor with a first ion beam having energies of at least 5 KeV for a sufficient amount of time to rupture a sufficient number of carbon-to-carbon bonds in the precursor to produce an amorphous film comprising randomly disposed carbon atoms in bonded networks;
   (c) subsequently directing a vaporized stream of hydrocarbon precursor toward the coated surface; and
   (d) bombarding coated surface and the hydrocarbon precursor with a second ion beam having energies of at least 5 KeV for a sufficient amount of time to rupture a sufficient number of carbon-to-hydrogen bonds in the precursor to produce a carbonaceous residue above the prior layer of said amorphous film.

15. The method of claim 14, wherein the hydrocarbon precursor is polyphenyl ether.

16. The method of claim 14, wherein the first and second ion beams comprise the same species of ions.

17. The method of claim 14, wherein said ion beams comprise fluorine.

18. The method of claim 17, wherein said ion beams comprise either $BF_3$ or $BF_2$.

19. The method of claim 14, wherein said ion beams comprise nitrogen.

20. An ion beam assisted method of producing a diamond-like carbon (DLC) coating having desired physical properties, comprising the steps of:

(a) directing a vaporized stream of fullerene precursor toward a surface to be coated, said fullerene precursor comprising fullerene molecules having noncarbonaceous side chains, said side chains being chosen to affect the physical properties consisting of hardness, coefficient of friction, catalytic activity or mechanical properties of the DLC coating; and (b) bombarding a surface to be coated and the fullerene precursor with an ion beams having energies in the range of 5-50 KeV for a sufficient amount of time to rupture a sufficient number of carbon-to-carbon bonds in the precursor to produce an amorphous film comprising randomly disposed carbon atoms in bonded networks, said precursor comprising atomic species selectively chosen to affect the physical properties of the DLC coating.

* * * * *